United States Patent [19]
Itano et al.

[11] Patent Number: 6,120,973
[45] Date of Patent: Sep. 19, 2000

[54] RADIATION SENSITIVE COMPOSITION FOR COLOR FILTERS

[75] Inventors: Kouji Itano; Shigeru Abe; Yasumi Itano, all of Mie, Japan

[73] Assignee: JSR Corporation, Tokyo, Japan

[21] Appl. No.: 09/064,223

[22] Filed: Apr. 22, 1998

[30] Foreign Application Priority Data

Apr. 30, 1997 [JP] Japan ................................ 9-124776

[51] Int. Cl.$^7$ ....................................... G03C 1/73
[52] U.S. Cl. .................... 430/285.1; 430/288.1; 430/910; 430/920; 430/922; 522/73; 522/121; 522/16; 522/26; 522/63
[58] Field of Search .............. 430/285.1, 288.1, 430/922, 920, 280.1, 910; 522/73, 121, 16, 26, 63

[56] References Cited

U.S. PATENT DOCUMENTS

| | | | |
|---|---|---|---|
| 5,368,976 | 11/1994 | Tajima et al. | 430/281.1 |
| 5,849,463 | 12/1998 | Tsuji et al. | 430/285.1 |
| 5,866,298 | 2/1999 | Iwamoto et al. | 430/281.1 |

FOREIGN PATENT DOCUMENTS

| | | |
|---|---|---|
| 62-094840 | 5/1987 | Japan . |
| 06067417 | 3/1994 | Japan . |
| 7-110577 | 4/1995 | Japan . |

OTHER PUBLICATIONS

English translation of JP 62094840 (Shimizu et al) (Publication Date:May 1st, 1987).
English Abstract of JP06067417—Derwent abstract (WPAT) Accession #94–121499/15 (Nakatsuka et al.) Mar. 11, 1994.
English Abstract of JP06067417—JAPIO abstract Accession #94–067417 (Nakatsuka et al.) Mar. 11, 1994.
English Abstract of JP62094840—Derwent abstract (WPAT) Accession #87–160163/23 (Shimizu et al.) May 1, 1987.
Patent Abstracts of Japan, vol. 011, No. 303 (P–622), Oct. 3, 1987, JP 62–094840, May 1, 1987.
Chemical Abstracts, vol. 121, No. 12, Sep. 19, 1994, JP 06–67417, Mar. 11, 1994.

*Primary Examiner*—Janet Baxter
*Assistant Examiner*—Sin J. Lee
*Attorney, Agent, or Firm*—Oblon, Spivak, McClelland, Maier & Neustadt, P.C.

[57] ABSTRACT

A radiation sensitive composition comprising (A) a colorant such as carbon black and an organic pigment, (B) an alkali-soluble resin comprising a copolymer of an N-substituted maleimide monomer and other copolymerizable monomer,(C) a polyfunctional monomer, and (D) a photopolymerization initiator.

11 Claims, No Drawings

RADIATION SENSITIVE COMPOSITION FOR COLOR FILTERS

DETAILED DESCRIPTION OF THE INVENTION

The present invention relates to a radiation sensitive composition for color filters. More specifically, it relates to a radiation sensitive composition for color filters, which makes it possible to produce a color filter having excellent developability, physical properties of a coating film thereof and the like, particularly a color filter for use in color liquid crystal display devices, color image pick-up tube elements and the like.

Heretofore, in the production of a color filter using a radiation sensitive composition, the pixels of each color are obtained by coating a radiation sensitive composition on a substrate or a substrate having a light shading layer of a desired pattern and drying it, and then by exposing and developing the resulting dried coating film into a desired pattern. The thus formed color filter, however, has problems that residues or surface stains are readily produced on an unexposed portion of the substrate or light shading layer at the time of development, the adhesion of the pixels formed in an exposed portion to the substrate or the light shading layer is insufficient, and the pixels post-baked after development are inferior in the physical properties of the coating film.

JP-A 7-110577 (the term "JP-A" as used herein means an "unexamined published Japanese patent application") discloses that a photopolymerizable composition comprising (1) a photopolymerization initiator, (2) an addition polymerizable monomer having an ethylenically unsaturated double bond, and (3) an alkali-soluble resin obtained by an imidization reaction between an aralkylamine compound having a primary amino group and a copolymer of styrene or nucleus substituted derivative thereof and maleic anhydride has alkali solubility and can be formed into a color filter excellent in developer resistance, alkali resistance, adhesion to a substrate, and the like. However, the control of the above imidization reaction is difficult, and pixels obtained from this composition are still unsatisfactory in view of heat resistance.

It is therefore an object of the present invention to provide a novel radiation sensitive composition for color filters.

It is another object of the present invention to provide a radiation sensitive composition for color filters which can form pixels exhibiting high developability and excellent in the physical properties of a coating film thereof.

It is a further object of the present invention to provide a novel radiation sensitive composition for color filters, which provides pixels having excellent adhesion both to a substrate and to a light shading layer and excellent heat resistance after they are developed and post-baked, without having residues and surface stains produced on an unexposed portion(s) of the substrate and light shading layer at the time of development.

Other objects and advantages of the present invention will become apparent from the following description.

According to the present invention, the above objects and advantages of the present invention can be attained by a radiation sensitive composition for color filters, which comprises (A) a colorant, (B) an alkali-soluble resin comprising a copolymer of an N-substituted maleimide monomer and other copolymerizable monomer, (C) a polyfunctional monomer and (D) a photopolymerization initiator.

The term "radiation" as used in the present invention comprehends visible light, ultraviolet light, far-ultraviolet light, electron beams, X-rays and the like.

Each component constituting the present invention will be described below.

(A) Colorant

The colorant in the present invention is not limited to a particular color tone and is suitably selected according to the application of the obtained color filter. It may be either organic or inorganic.

Illustrative examples of the organic colorant includes organic synthetic dyes, organic pigments, organic natural coloring matters and the like. Illustrative examples of the inorganic colorant include inorganic pigments, inorganic salts called "extender pigment" and the like. Since high-definition color development and heat resistance are generally required for color filters, the colorant used in the present invention preferably has high color developing properties and high heat resistance, particularly preferably high resistance to heat decomposition. An organic colorant is generally used, and an organic pigment is particularly preferably used.

Illustrative examples of the organic pigment include compounds classified into the group of pigments according to Color Index (C.I.; issued by The Society of Dyers and Colourists) and having the following color index (C.I.) numbers, such as C.I. Pigment Yellow 1, C.I.

Pigment Yellow 3, C.I. Pigment Yellow 12, C.I. Pigment Yellow 13, C.I. Pigment Yellow 14, C.I. Pigment Yellow 16, C.I. Pigment Yellow 17, C.I. Pigment Yellow 20, C.I. Pigment Yellow 24, C.I. Pigment Yellow 31, C.I. Pigment Yellow 55, C.I. Pigment Yellow 60, C.I. Pigment Yellow 65, C.I. Pigment Yellow 73, C.I. Pigment Yellow 74, C.I.

Pigment Yellow 81, C.I. Pigment Yellow 83, C.I. Pigment Yellow 93, C.I. Pigment Yellow 95, C.I. Pigment Yellow 97, C.I. Pigment Yellow 98, C.I. Pigment Yellow 100, C.I.

Pigment Yellow 101, C.I. Pigment Yellow 104, C.I. Pigment Yellow 106, C.I. Pigment Yellow 108, C.I. Pigment Yellow 109, C.I. Pigment Yellow 110, C.I. Pigment Yellow 113, C.I. Pigment Yellow 114, C.I. Pigment Yellow 116, C.I. Pigment Yellow 117, C.I. Pigment Yellow 119, C.I. Pigment Yellow 120, C.I. Pigment Yellow 126, C.I. Pigment Yellow 127, C.I. Pigment Yellow 128, C.I. Pigment Yellow 129, C.I. Pigment Yellow 138, C.I. Pigment Yellow 139, C.I. Pigment Yellow 150, C.I. Pigment Yellow 151, C.I. Pigment Yellow 152, C.I. Pigment Yellow 153, C.I. Pigment Yellow 154, C.I. Pigment Yellow 155, C.I. Pigment Yellow 156, C.I. Pigment Yellow 166, C.I. Pigment Yellow 168 and C.I. Pigment Yellow 175; C.I.

Pigment Orange 36, C.I. Pigment Orange 43, C.I. Pigment Orange 51, C.I. Pigment Orange 61, C.I. Pigment Orange 71 and C.I. Pigment Orange 73; C.I. Pigment Red 9, C.I.

Pigment Red 88, C.I. Pigment Red 97, C.I. Pigment Red 122, C.I. Pigment Red 123, C.I. Pigment Red 149, C.I.

Pigment Red 168, C.I. Pigment Red 176, C.I. Pigment Red 177, C.I. Pigment Red 180, C.I. Pigment Red 209, C.I.

Pigment Red 215, C.I. Pigment Red 224, C.I. Pigment Red 242, C.I. Pigment Red 254, C.I. Pigment Red 255 and C.I.

Pigment Red 265; C.I. Pigment Violet 19, C.I. Pigment Violet 23 and C.I. Pigment Violet 29; C.I. Pigment Blue 15, C.I. Pigment Blue 15:3, C.I. Pigment Blue 15:4, C.I. Pigment Blue 15:6 and C.I. Pigment Blue 60; C.I. Pigment Green 7 and C.I. Pigment Green 36; C.I. Pigment Brown 23 and C.I. Pigment Brown 25; and C.I. Pigment Black 1 and C.I. Pigment Black 7.

Illustrative examples of the inorganic colorant include titanium oxide, barium sulfate, calcium carbonate, zinc oxide, lead sulfate, yellow lead, zinc yellow, red iron oxide (III), cadmium red, ultramarine blue, Prussian blue, chromium oxide green, cobalt green, amber, titanium black, synthetic iron black, carbon black and the like.

The particle surfaces of these colorants can be modified with a polymer as required.

The above colorants may be used alone or in admixture of two or more.

The colorant in the present invention can be used in combination with a dispersant as desired.

The dispersant is, for example, a cationic, anionic, nonionic or amphoteric surfactant, or a silicone-based or fluorine-based surfactant in terms of composition.

Illustrative examples of the surfactant include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethyleneimines; those available under the trade names of KP (a product of Shin-Etsu Chemical Co., Ltd), Polyflow (a product of KYOEISHA CHEMICAL Co., Ltd), F-Top (a product of Tochem Products Co., Ltd), MEGAFAC (a product of Dainippon Ink & Chemicals, Inc.), Fluorad (a product of Sumitomo 3M Ltd), Asahi Guard and Surflon (products of Asahi Glass Co., Ltd); and the like.

These surfactants may be used alone or in admixture of two or more.

The surfactant is generally used in an amount of 50 parts or less by weight, preferably 0 to 30 parts by weight, based on 100 parts by weight of the colorant.

(B) Alkali-soluble resin

The alkali-soluble resin in the present invention contains a copolymer of an N-substituted maleimide monomer and other copolymerizable monomer (to be referred to as "N-substituted maleimide copolymer" hereinafter).

The N-substituent of the N-substituted maleimide monomer is preferably a straight-chain or branched-chain alkyl group having 1 to 18 carbon atoms, cycloalkyl group having 5 to 14 carbon atoms, aryl group having 6 to 18 carbon atoms or aralkyl group having 7 to 18 carbon atoms. The N-substituent itself may be further substituted. The substituent for the N-substituent is preferably, for example, a hydroxyl group, carboxyl group, sulfonyl group, amino group, glycidyloxy group, alkoxy group having 1 to 8 carbon atoms or group represented by $C_nH_{2n}COO—$ (in which n is an integer of 1 to 8).

Illustrative examples of the N-substituted maleimide monomer include N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide and the like.

These N-substituted maleimide monomers may be used alone or in admixture of two or more.

The other copolymerizable monomer is not limited to a particular kind as long as it is copolymerizable with the N-substituted maleimide monomer. Particularly, the preferred monomer is preferably a monomer mixture of an ethylenically unsaturated monomer having at least one carboxyl group in the molecule (to be simply referred to as "carboxyl group-containing unsaturated monomer" hereinafter) and other copolymerizable monomer (to be simply referred to as "other monomer" hereinafter). The other monomer is preferably an aromatic vinyl compound.

Illustrative examples of the carboxyl group-containing unsaturated monomer include unsaturated monocarboxylic acids such as acrylic acid, methacrylic acid, crotonic acid, α-chloroacrylic acid, ethacrylic acid, cinnamic acid, ω-carboxy-polycaprolactone monoacrylate, ω-carboxy-polycaprolactone monomethacrylate, 2-acryloyloxyethyl succinic acid and 2-methacryloyloxyethyl succinic acid; unsaturated dicarboxylic acids (anhydrides) such as maleic acid, maleic anhydride, fumaric acid, itaconic acid, itaconic anhydride, citraconic acid, citraconic anhydride and mesaconic acid; unsaturated polycarboxylic acids (anhydrides) having at least three carboxyl groups in the molecules; and the like.

These carboxyl group-containing unsaturated monomers may be used alone or in admixture of two or more.

The aromatic vinyl compound as the other monomer is preferably a compound represented by the following general formula.

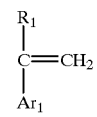

wherein $R_1$ is a hydrogen atom or an alkyl group having 1 to 8 carbon atoms, and $Ar_1$ is an aryl group having 6 to 18 carbon atoms which may be substituted by a hydroxyl group, carboxyl group, sulfonyl group, glycidyloxy group, alkoxyl group having 1 to 8 carbon atoms or group represented by $C_nH_{2n}COO—$ (in which n is an integer of 1 to 8).

Illustrative examples of the aromatic vinyl compound include styrene, α-methylstyrene, o-vinyltoluene, m-vinyltoluene, p-vinyltoluene, p-chlorostyrene, o-methoxystyrene, m-methoxystyrene, p-methoxystyrene, indene, p-vinylbenzyl methyl ether and p-vinylbenzyl glycidyl ether. Of these, styrene is particularly preferred. Other examples of the other monomer include unsaturated carboxylic acid esters such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, glycerol acrylate, glycerol methacrylate, allyl acrylate, allyl methacrylate, benzyl acrylate, benzyl methacrylate, phenyl acrylate, phenyl methacrylate, methoxytriethylene glycol acrylate and methoxytriethylene glycol methacrylate; unsaturated carboxylic acid aminoalkyl esters such as 2-aminoethyl acrylate, 2-aminoethyl methacrylate, 2-aminopropyl acrylate, 2-aminopropyl methacrylate, 3-aminopropyl acrylate and 3-aminopropyl methacrylate; unsaturated carboxylic acid glycidyl esters such as glycidyl acrylate and glycidyl methacrylate; carboxylic acid vinyl esters such as vinyl acetate, vinyl propionate, vinyl butyrate and vinyl benzoate; unsaturated ethers such as vinylmethyl ether, vinylethyl ether, allyl glycidyl ether and methallyl glycidyl ether; vinyl cyanide compounds such as acrylonitrile, methacrylonitrile, α-chloroacrylonitrile and vinylidene cyanide; unsaturated amides such as acrylamide, methacrylamide, α-chloroacrylamide, N-hydroxyethyl acrylamide and N-hydroxyethyl methacrylamide; aliphatic conjugated dienes such as 1,3-butadiene, isoprene and chloroprene; macromonomers having a monoacryloyl group or monomethacryloyl group at the terminal of a polymer molecular chain such as polystyrene, polymethyl acrylate, polymethyl methacrylate, poly-n-butyl acrylate, poly-n-butyl methacrylate and polysiloxane; and the like.

These other monomers may be used alone or in admixture of two or more.

The N-substituted maleimide copolymer is preferably a copolymer of N-phenylmaleimide, more preferably a copolymer of N-phenylmaleimide, a carboxyl group-containing unsaturated monomer and other monomer, particularly preferably a copolymer (to be referred to as "alkali-soluble resin (I)" hereinafter) of N-phenylmaleimide, (1) acrylic acid and/or methacrylic acid, (2) styrene and (3) at least one member selected from the group consisting of methyl acrylate, methyl methacrylate, 2-hydroxyethyl acrylate, 2-hydroxyethyl methacrylate, benzyl acrylate, benzyl methacrylate, phenyl acrylate, phenyl methacrylate, polystyrene macromonomer and polymethyl methacrylate macromonomer.

Illustrative examples of the alkali-soluble resin (I) include N-phenylmaleimide/methacrylic acid/styrene/benzyl methacrylate copolymer, N-phenylmaleimide/methacrylic acid/styrene/phenyl methacrylate copolymer, N-phenylmaleimide/methacrylic acid/styrene/benzyl methacrylate/polystyrene macromonomer copolymer, N-phenylmaleimide/methacrylic acid/styrene/benzyl methacrylate/polymethyl methacrylate macromonomer copolymer, N-phenylmaleimide/methacrylic acid/styrene/phenyl methacrylate/polystyrene macromonomer copolymer, N-phenylmaleimide/methacrylic acid/styrene/phenyl methacrylate/polymethyl methacrylate macromonomer copolymer/N-phenylmaleimide/methacrylic acid/styrene/2-hydroxyethyl methacrylate/benzyl methacrylate/polystyrene macromonomer copolymer, N-phenylmaleimide/methacrylic acid/styrene/2-hydroxyethyl methacrylate/benzyl methacrylate/polymethyl methacrylate macromonomer copolymer, N-phenylmaleimide/methacrylic acid/styrene/2-hydroxyethyl methacrylate/phenyl methacrylate/polystyrene macromonomer copolymer, N-phenylmaleimide/methacrylic acid/styrene/2-hydroxyethyl methacrylate/phenyl methacrylate/polymethyl methacrylate macromonomer copolymer, and the like.

The proportion of the N-substituted maleimide monomer in the N-substituted maleimide copolymer is preferably 5 to 50% by weight, more preferably 10 to 40% by weight. When the proportion of the N-substituted maleimide monomer is less than 5% by weight, the heat resistance of the obtained pixel is liable to lower, while when the proportion is more than 50% by weight, the alkali solubility of the obtained copolymer is apt to deteriorate with the consequence that residues or surface stains may be produced on an unexposed portion(s) of the substrate or the light shading layer.

When the N-substituted maleimide copolymer is a copolymer of an N-substituted maleimide monomer, carboxyl group-containing unsaturated monomer and other monomer, the copolymer proportion of the carboxyl group-containing unsaturated monomer is preferably 5 to 50% by weight, more preferably 10 to 40% by weight, and the copolymer proportion of the other monomer is preferably 10 to 90% by weight, more preferably 20 to 80% by weight. When the proportion of the carboxyl group-containing unsaturated monomer is less than 5% by weight, the solubility in an alkali developer of the obtained radiation composition is liable to lower, while when the proportion is more than 50% by weight, the formed pixel tends to fall off from the substrate, or the surface of the pixel is apt to be roughened at the time of development with an alkali developer. Particularly, the N-substituted maleimide copolymer containing the carboxyl group-containing unsaturated monomer in the above-specified proportion has excellent solubility in an alkali developer. In a radiation sensitive composition containing the copolymer as a binder, an undissolved substance rarely remains after development with an alkali developer, surface stains or residues are hardly produced in an area other than a portion(s) where pixels are formed, of the substrate and the pixels obtained from the composition are not dissolved excessively in the alkali developer, have excellent adhesion to the substrate and do not fall off from the substrate.

When the other monomer contains an aromatic vinyl compound, the copolymer proportion of the aromatic vinyl compound is preferably 5 to 40% by weight, more preferably 10 to 30% by weight. When the proportion of the aromatic vinyl compound is more than 40% by weight, the solubility in an alkali developer of the obtained radiation sensitive composition is apt to lower. Particularly, an N-substituted maleimide copolymer containing a carboxyl group-containing unsaturated monomer and an aromatic vinyl compound each in the above specific ratio is excellent in the balance between solubility in an alkali developer and the strength of a coating film thereof. A radiation sensitive composition comprising the copolymer as a binder hardly produce surface stains, residues or the like, and has excellent adhesion to the substrate and appropriate strength.

The above N-substituted maleimide copolymers may be used alone or in admixture of two or more.

In the present invention, other alkali-soluble resin can be used in combination with the N-substituted maleimide copolymer as the case may be.

Illustrative examples of such other alkali-soluble resin include resins containing an acidic functional group such as carboxyl group or phenolic hydroxyl group.

The resin containing a carboxyl group of the other alkali-soluble resins is preferably a copolymer of the carboxyl group-containing unsaturated monomer and the other monomer, more preferably a copolymer (to be referred to as "alkali-soluble resin (II)" hereinafter) of (1) acrylic acid and/or methacrylic acid and (2) at least one member selected from the group consisting of methyl methacrylate, 2-hydroxyethyl acrylate, 2-hydroxyethyl methacrylate, benzyl acrylate, benzyl methacrylate, styrene, polystyrene macromonomer and polymethyl methacrylate macromonomer.

Illustrative examples of the alkali-soluble resin (II) include acrylic acid copolymers such as acrylic acid/benzyl acrylate copolymer, methacrylic acid/benzyl acrylate copolymer, acrylic acid/benzyl acrylate/styrene copolymer, methacrylic acid/benzyl acrylate/styrene copolymer, acrylic acid/methyl acrylate/styrene copolymer, methacrylic acid/methyl acrylate/styrene copolymer, acrylic acid/benzyl acrylate/polystyrene macromonomer copolymer, methacrylic acid/benzyl acrylate/polystyrene macromonomer copolymer, acrylic acid/benzyl acrylate/polymethyl methacrylate macromonomer copolymer, methacrylic acid/ benzyl acrylate/polymethyl methacrylate macromonomer copolymer, acrylic acid/methyl acrylate/polystyrene macromonomer copolymer, methacrylic acid/methyl acrylate/polystyrene macromonomer copolymer, acrylic acid/methyl acrylate/polymethyl methacrylate macromonomer copolymer, methacrylic acid/methyl acrylate/polymethyl methacrylate macromonomer copolymer, acrylic acid/benzyl methacrylate copolymer, methacrylic acid/benzyl methacrylate copolymer, acrylic acid/benzyl methacrylate and styrene copolymer, methacrylic acid/benzyl methacrylate/styrene copolymer, acrylic acid/methyl methacrylate/styrene copolymer, methacrylic acid/methyl methacrylate/styrene copolymer, acrylic acid/benzyl methacrylate/polystyrene macromonomer copolymer, methacrylic acid/benzyl methacrylate/polystyrene macromonomer copolymer, acrylic acid/benzyl methacrylate/polymethyl methacrylate macromonomer copolymer, methacrylic acid/benzyl methacrylate/polymethyl methacrylate macromonomer copolymer, acrylic acid/methyl methacrylate/polystyrene macromonomer copolymer, methacrylic acid/methyl methacrylate/polystyrene macromonomer copolymer, acrylic acid/methyl methacrylate/polymethyl methacrylate macromonomer copolymer, methacrylic acid/methyl methacrylate/polymethyl methacrylate macromonomer copolymer, acrylic acid/2-hydroxyethyl methacrylate/benzyl methacrylate/polystyrene macromonomer copolymer, methacrylic acid/2-hydroxyethyl methacrylate/benzyl methacrylate/polystyrene macromonomer copolymer, acrylic acid/2-hydroxyethyl methacrylate/benzyl methacrylate/polymethyl methacrylate macromonomer copolymer, methacrylic acid/2-hydroxyethyl methacrylate/benzyl methacrylate/polymethyl methacrylate macromonomer copolymer, and the like.

These alkali-soluble resins (II) may be used alone or in admixture of two or more.

The amount of the resin when the other alkali-soluble resin is used is generally 50% by weight or less, preferably 30% by weight or less based on the total amount of the alkali-soluble resins. When the amount of the other alkali-soluble resin is more than 50% by weight, the heat resistance of the obtained pixel is liable to deteriorate.

The alkali-soluble resins (I) and (II) in the present invention have a weight average molecular weight in view of polystyrene measured by gel permeation chromatography (GPC: tetrahydrofuran as an elution solvent) (to be simply referred to as "weight average molecular weight" hereinafter) of preferably 3,000 to 300,000, particularly preferably 5,000 to 100,000. By using the alkali-soluble resin having such specified weight average molecular weight, a radiation sensitive composition having excellent developability can be obtained, pixels having a sharp pattern edge can be formed thereby, and surface stains, resin residues or the like are hardly produced in an area other than a portion(s) where pixels are formed, of the substrate at the time of development.

The proportion of the alkali-soluble resin in the present invention is preferably 10 to 1,000 parts by weight, more preferably 20 to 500 parts by weight, based on 100 parts by weight of the colorant (A). When the proportion of the alkali-soluble resin is less than 10 parts by weight, alkali developability may deteriorate, or surface stains or residues may be produced in an area other than a portion(s) where pixels are formed. On the other hand, when the proportion is more than 1,000 parts by weight, the resulting thin film may be difficult to achieve a target color density due to a relative reduction in the concentration of the colorant.

(C) Polyfunctional monomer

As the polyfunctional monomer in the present invention, a compound having at least 2, preferably 2 to 6 acrylate groups or methacrylate groups in the molecule is advantageously used.

Illustrative examples of the polyfunctional monomer include diacrylates and dimethacrylates of alkylene glycols such as ethylene glycol and propylene glycol; diacrylates and dimethacrylates of polyalkylene glycols such as polyethylene glycol and polypropylene glycol; polyacrylates and polymethacrylates of polyhydric alcohols having at least three hydroxyl groups, such as glycerine, trimethylolpropane, pentaerythritol and dipentaerythritol, and dicarboxylic acid modified products thereof; oligoacrylates and oligomethacrylates such as polyesters, epoxy resins, urethane resins, alkyd resins, silicone resins and spiran resins; diacrylates and dimethacrylates of both terminal hydroxylated polymers such as polybutadiene having hydroxyl groups at both terminals, polyisoprene having hydroxyl groups at both terminals and polycaprolactone having hydroxyl groups at both terminals: trisacryloyloxyethyl phosphate, trimethacryloyloxyethyl phosphate, and the like.

Of these polyfunctional monomers, polyacrylates and polymethacrylates of polyhydric alcohols having at least three hydroxyl groups and dicarboxylic acid modified products thereof are particularly preferred, as exemplified by trimethylolpropane triacrylate, trimethylolpropane trimethacrylate, pentaerythritol triacrylate, pentaerythritol trimethacrylate, succinic acid-modified pentaerythritol triacrylate, succinic acid modified pentaerythritol trimethacrylate, pentaerythritol tetraacrylate, pentaerythritol tetramethacrylate, dipentaerythritol hexacrylate, dipentaerythritol hexamethacrylate and the like. Above all, trimethylpropane triacrylate, pentaerythritol triacrylate and dipentaerythritol hexacrylate are particularly preferred because pixels having high strength and excellent surface smoothness are obtained and surface stains or residues are hardly produced in an area other than a portion(s) where pixels are formed.

The polyfunctional monomers may be used alone or in admixture of two or more.

The proportion of the polyfunctional monomer used in the present invention is preferably 5 to 500 parts by weight, more preferably 20 to 300 parts by weight, based on 100 parts by weight of the alkali-soluble resin (B). When the proportion of the polyfunctional monomer is less than 5 parts by weight, the pixel strength and pixel surface smoothness are liable to deteriorate, while when the proportion thereof is more than 500 parts by weight, alkali developability is apt to lower and surface stains or residues are readily produced in an area other than a portion(s) where pixels are formed.

In the present invention, part of the polyfunctional monomer may be substituted by a monofunctional monomer.

Illustrative examples of the monofunctional monomer include ω-carboxy-polycaprolactone monoacrylate, ω-carboxy-polycaprolactone monomethacrylate, methoxytriethylene glycol acrylate, methoxytriethylene glycol methacrylate, methoxydipropylene glycol acrylate, methoxydipropylene glycol methacrylate, 2-hydroxy-3-phenoxypropyl acrylate, 2-hydroxy-3-phenoxypropyl methacrylate, 2-acryloyloxyethylsuccinic acid, 2-methacryloylethylsuccinic acid and the like.

These monofunctional monomers may be used alone or in admixture of two or more.

The proportion of the monofunctional monomer is preferably 0 to 90% by weight, more preferably 0 to 50% by weight, based on the total of the polyfunctional monomer and the monofunctional monomer.

(D) Photopolymerization initiator

The term "photopolymerization initiator" as used in the present invention means a compound which generates radical, cationic or anionic active species capable of initiating the polymerization of the polyfunctional monomer (C) due to decomposition or cleavage of a bond caused by exposure.

The photopolymerization initiator is a compound having an imidazole ring, compound having a benzoin bond, other photoradical generating agent, compound having a trihalomethyl group, or the like.

Illustrative examples of the compound having an imidazole ring include compounds represented by the following general formula (1) (to be referred to as "biimidazole-based compound (1)" hereinafter):

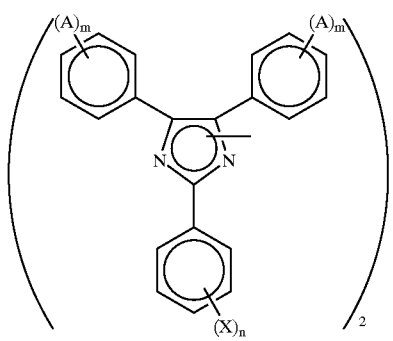

(1)

wherein X is a hydrogen atom, halogen atom, cyano group, alkyl group having 1 to 4 carbon atoms or aryl group having 6 to 9 carbon atoms, A is —COO—R (in which R is an alkyl group having 1 to 4 carbon atoms or aryl group having 6 to 9 carbon atoms), m is an integer of 1 to 3, and n is an integer of 1 to 3, compounds represented by the following general formula (2) (to be referred to as "biimidazole-based compound (2)" hereinafter):

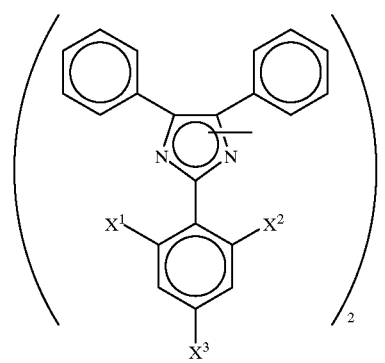

(2)

wherein $X^1$, $X^2$ and $X^3$ may be the same or different and are a hydrogen atom, halogen atom, cyano group, alkyl group having 1 to 4 carbon atoms or aryl group having 6 to 9 carbon atoms, provided that two or more of $X^1$, $X^2$ and $X^3$ cannot be a hydrogen atom at the same time, and the like.

In the above general formulas (1) and (2), the bond between two imidazole units is represented by at least one of the following formulas (3) to (5).

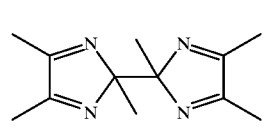

(3)

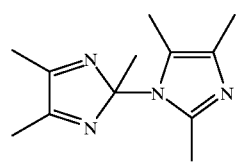

(4)

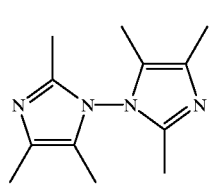

(5)

Therefore, the biimidazole-based compound (1) and the biimidazole-based compound (2) are one of the compounds having any one of the above formulas (3) to (5) as the main skeleton, or a mixture of two or more thereof.

In the general formulas (1) and (2), illustrative examples of the halogen atom represented by X, $X^1$, $X^2$ and $X^3$ include chlorine atom, bromine atom, iodine atom and the like, illustrative examples of the alkyl group having 1 to 4 carbon atoms include methyl group, ethyl group, n-propyl group, i-propyl group, n-butyl group, i-butyl group, sec-butyl group, t-butyl group and the like, and illustrative examples of the aryl group having 6 to 9 carbon atoms include phenyl group, o-tolyl group, m-tolyl group, p-tolyl group and the like.

In the general formula (1), R in —COO—R represented by A is an alkyl group having 1 to 4 carbon atoms or aryl group having 6 to 9 carbon atoms, as exemplified for X.

Illustrative examples of the biimidazole-based compound (1) and the biimidazole-based compound (2) are as follows.

Those of the biimidazole-based compound (1) include 2,2'-bis(2-chlorophenyl)-4,4',5,5'-tetrakis(4-ethoxycarbonylphenyl)-1,2'-biimidazole, 2,2'-bis(2-chlorophenyl)-4,4',5,5'-tetrakis(4-phenoxycarbonylphenyl)-1,2'-biimidazole, 2,2'-bis(2,4-dichlorophenyl)-4,4',5,5'-tetrakis(4-ethoxycarbonylphenyl)-1,2'-biimidazole, 2,2'-bis(2,4-dichlorophenyl)-4,4',5,5'-tetrakis(4-phenoxycarbonylphenyl)-1,2'-biimidazole, 2,2'-bis(2,4,6-trichlorophenyl)-4,4',5,5'-tetrakis(4-ethoxycarbonylphenyl)-1,2'-biimidazole, 2,2'-bis(2,4,6-trichlorophenyl)-4,4',5,5'-tetrakis(4-phenoxycarbonylphenyl)-1,2'-biimidazole, 2,2'-bis(2-cyanophenyl)-4,4',5,5'-tetrakis(4-ethoxycarbonylphenyl)-1,2'-biimidazole, 2,2'-bis(2-cyanophenyl)-4,4',5,5'-tetrakis(4-phenoxycarbonylphenyl)-1,2'-biimidazole, 2,2'-bis(2-methylphenyl)-4,4',5,5'-tetrakis(4-methoxycarbonylphenyl)-1,2'-biimidazole, 2,2'-bis(2-methylphenyl)-4,4',5,5'-tetrakis(4-ethoxycarbonylphenyl)-1,2'-biimidazole, 2,2'-bis(2-methylphenyl)-4,4',5,5'-tetrakis (4-phenoxycarbonylphenyl)-1,2'-biimidazole, 2,2'-bis(2-ethylphenyl)-4,4',5,5'-tetrakis(4-methoxycarbonylphenyl)-1,2'-biimidazole, 2,2'-bis(2-ethylphenyl)-4,4',5,5'-tetrakis(4-ethoxycarbonylphenyl)-1,2'-biimidazole, 2,2'-bis(2-ethylphenyl)-4,4',5,5'-tetrakis(4-phenoxycarbonylphenyl)-1,2'-biimidazole, 2,2'-bis(2-phenylphenyl)-4,4',5,5'-tetrakis(4-methoxycarbonylphenyl)-1,2'-biimidazole, 2,2'-bis(2-phenylphenyl)-4,4',5,5'-tetrakis(4-ethoxycarbonylphenyl)-1,2'-biimidazole, 2,2'-bis(2-phenylphenyl)- 4,4',5,5'-tetrakis(4-phenoxycarbonylphenyl)-1,2'-biimidazole, and the like.

Those of the biimidazole-based compound (2) include 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-tribromophenyl)-4,4',5,5'-tetraphenyl-1,2'-biimidazole, 2,2'-bis(2,4-dicyanophenyl)-4,4',5,5'-tetraphenyl-1,2'-biimidazole, 2,2'-bis(2,4,6-tricyanophenyl)-4,4',5,5'-tetraphenyl-1,2'-biimidazole, 2,2'-bis(2,4-dimethylphenyl)-4,4',5,5'-tetraphenyl-1,2'-biimidazole, 2,2'-bis(2,4,6-trimethylphenyl)-4,4',5,5'-tetraphenyl-1,2'-biimidazole, 2,2'-bis(2,4-diethylphenyl)-4,4',5,5'-tetraphenyl-1,2'-biimidazole, 2,2'-bis(2,4,6-triethylphenyl)-4,4',5,5'-tetraphenyl-1,2'-biimidazole, 2,2'-bis(2,4-diphenylphenyl)-4,4',5,5'-tetraphenyl-1,2'-biimidazole, 2,2'-bis(2,4,6-triphenylphenyl)-4,4',5,5'-tetraphenyl-1,2'-biimidazole, and the like.

Of these, the particularly preferred biimidazole-based compound (1) is 2,2'-bis(2-chlorophenyl)-4,4',5,5'-tetrakis(4-ethoxycarbonylphenyl)-1,2'-biimidazole or 2,2'-bis(2-bromophenyl)-4,4',5,5'-tetrakis(4-ethoxycarbonyphenyl)-1,2'-biimidazole. The particularly prefererred biimidazole-based compound (2) is 2,2'-bis(2,4-dichlorophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-trichlorophenyl)-4,4',5,5'-tetraphenyl-1,2'-biimidazole or 2,2'-bis(2,4,6-tribromophenyl)-4,4',5,5'-tetraphenyl-1,2'-biimidazole.

The biimidazole-based compound (1) and the biimidazole-based compound (2) have excellent solubility in a solvent and rarely produce foreign matters such as undissolved substances and precipitates. In addition, they have high sensitivity, allow a curing reaction to proceed by exposure with a small amount of energy, provide a high contrast and do not cause a curing reaction in unexposed portion(s). Therefore, the exposed coating films of these compounds are clearly divided into cured portions insoluble in a developer and uncured portions having high solubility in the developer, thereby making it possible to form a color filter free from a partial or complete loss or undercut of a pixel pattern.

In the present invention, the biimidazole-based compounds (1) and the biimidazole-based compounds (2) may be used alone or in admixture of two or more independently, or the biimidazole-based compounds (1) and (2) may be used in combination.

Illustrative examples of the compound having a benzoin bond and other photoradical generating agent include 2-hydroxy-2-methyl-1-phenylpropane-1-one, 1-(4-isopropylphenyl)-2-hydroxy-2-methylpropane-1-one, 4-(2-hydroxyethoxy)phenyl-(2-hydroxy-2-propyl)ketone, 1-hydroxycyclohexylphenylketone, 2,2-dimethoxy-2-phenylacetophenone, 2-methyl-(4-methylthiophenyl)-2-morpholino-1-propane-1-one, 2-benzyl-2-dimethylamino-1-(4-morpholinophenyl)butane-1-one, benzophenone, 2,4-diethylthioxanthone, 3,3-dimethyl-4-methoxybenzophenone, 4-azidobenzaldehyde, 4-azidoacetophenone, 4-azidobenzalacetophenone, azidopyrene, 4-diazodiphenylamine, 4-diazo-4'-methoxydiphenylamine, 4-diazo-3-methoxydiphenylamine, bis(2,6-dimethoxybenzoyl)-2,4,4-trimethylpentylphosphine oxide, dibenzoyl, benzoinisobutylether, N-phenylthioacridone, triphenylpyrylium perchlorate and the like.

Illustrative examples of the compound having a trihalomethyl group include 2,4,6-tris(trichloromethyl)-s-triazine, 2-(2'-chlorophenyl)-4,6-bis(trichloromethyl)-s-triazine, 2-(4'-chlorophenyl)-4,6-bis(trichloromethyl)-s-triazine, 2-(2'-methoxyphenyl)-4,6-bis(trichloromethyl)-s-triazine, 2-(4'-methoxyphenyl)-4,6-bis(trichloromethyl)-s-triazine, 2-(2'-furylethylidene)-4,6-bis(trichloromethyl)-s-triazine and the like.

Of the above compounds having a benzoin bond, other photoradical generating agents and compounds having a trihalomethyl group, 2-hydroxy-2-methyl-1-phenylpropane-1-one, 2-methyl-(4-methylthiophenyl)-2-morpholino-1-propane-1-one and 2-benzyl-2-dimethylamino-1-(4-morpholinophenyl)butane-1-one are preferred because the formed pixels hardly fall off from the substrate at the time of development and the pixel strength and sensitivity are high.

In the present invention, the compounds having a biimidazole ring, compounds having a benzoin bond, other photoradical generating agents and compounds having a trihalomethyl group may be used alone or in combination of two or more.

In the present invention, the compound having a biimidazole ring, compound having a benzoin bond, other photoradical generating agent and compound having a trihalomethyl group can be used in conjunction with at least one member selected from the group consisting of a sensitizer, curing promoting agent, and crosslinking agent or photosensitizer, both of which are composed of a polymer compound, as required (to be referred to as "polymer photocrosslinking-sensitizing agent" hereinafter).

Illustrative examples of the sensitizer include 4,4'-bis(dimethylamino)benzophenone, 4,4'-bis(diethylamino)benzophenone, 4-diethylaminoacetophenone, 4-dimethylaminopropiophenone, ethyl-4-dimethylaminobenzoate, 2-ethylhexyl-1,4-dimethylaminobenzoate, 2,5-bis(4'-diethylaminobenzal)cyclohexanone, 7-diethylamino-3-(4-diethylaminobenzoyl)coumarin, 4-(diethylamino)chalcone and the like.

Illustrative examples of the curing promoting agent include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-1H-tetrazole, 3-mercapto-4-methyl-4H-1,2,4-triazole and the like.

Further, the polymer crosslinking-sensitizing agent is a polymer compound having a functional group, which can function as a crosslinking agent and/or photosensitizing agent, in the main chain and/or side chain. Illustrative examples of the polymer photocrosslinking-sensitizing agent include a condensate of 4-azidobenzaldehyde and polyvinyl alcohol; condensate of 4-azidobenzaldehyde and phenol novolak resin; homopolymer and copolymer of 4-acryloylphenylcinnamoyl ester; 1,4-polybutadiene; 1,2-polybutadiene; and the like.

Of the above sensitizing agents, curing promoting agents and polymer photocrosslinking-sensitizing agents, 4,4'-bis(dimethylamino)benzophenone, 4,4'-bis(diethylamino)benzophenone and 2-mercaptobenzothiazole are preferred because the formed pixels hardly fall off from the substrate at the time of development and the pixel strength and sensitivity are high.

In the present invention, the photopolymerization initiator is particularly preferably a combination of at least one member selected from the group consisting of the biimidazole-based compound (1) and the biimidazole-based compound (2) and at least one member selected from the group consisting of a benzophenone-based compound having a benzoin bond, other benzophenone-based photoradical generating agent, benzophenone-based sensitizer and thiazole-based curing promoting agent.

Particularly preferred combinations of the above compounds include a combination of 2,2'-bis(2-chlorophenyl)-4,4',5,5'-tetrakis(4-ethoxycarbonylphenyl)-1,2'-biimidazole and 4,4'-bis(diethylamino)benzophenone, a combination of 2,2'-bis(2-chlorophenyl)-4,4',5,5'-tetrakis(4-ethoxycarbonylphenyl)-1,2'-biimidazole, 4,4'-bis(diethylamino)benzophenone and 2-benzyl-2-dimethylamino-1-(4-morpholinophenyl)butan-1-one, a combination of 2,2'-bis(2-chlorophenyl)-4,4',5,5'-tetrakis(4-ethoxycarbonylphenyl)-1,2'-biimidazole, 4,4'-bis(diethylamino)benzophenone and 1-hydroxycyclohexylphenyl ketone, a combination of 2,2'-bis(2-chlorophenyl)-4,4',5,5'-tetrakis(4-ethoxycarbonylphenyl)-1,2'-biimidazole, 4,4'-bis(dimethylamino)benzophenone, 1-hydroxycyclohexylphenyl ketone and 2-mercaptobenzothiazole, a combination of 2,2'-bis(2,4-dichlorophenyl)-4,4',5,5'-tetraphenyl-1,2'-biimidazole and 4,4'-bis(diethylamino)benzophenone, a combination of 2,2'-bis(2,4-dibromophenyl)-4,4',5,5'-tetraphenyl-1,2'-biimidazole, 4,4'-bis(diethylamino)benzophenone and 2-benzyl-2-dimethylamino-1-(4-morpholinophenyl)butan-1-one, a combination of 2,2'-bis(2,4-dibromophenyl)-4,4',5,5'-tetraphenyl-1,2'-biimidazole, 4,4'-bis(diethylamino)benzophenone and 1-hydroxycyclohexylphenyl ketone, a combination of 2,2'-bis(2,4,6-trichlorophenyl)-4,41,5,5'-tetraphenyl-1,2'-biimidazole, 4,4'-bis(dimethylamino)benzophenone, 1-hydroxycyclohexylphenyl ketone and 2-mercaptobenzothiazole, and the like.

In the present invention, the total amount of the compound having a benzoin bond, other photoradical generating agent and a compound having a trihalomethyl group is preferably 80% by weight or less of the whole amount of the photopolymerization initiator, the total amount of the sensitizer and the curing promoting agent is preferably 80% by weight or less of the whole amount of the photopolymerization initiator, and the amount of the polymer photocrosslinking-sensitizing agent is generally 200 parts or less by weight, preferably 0.01 to 200 parts by weight, more preferably 50 to 180 parts by weight, based on 100 parts by weight of the total of the biimidazole-based compound (1) and the biimidazole-based compound (2).

The amount of the photopolymerization initiator used in the present invention is preferably 0.01 to 500 parts by weight, more preferably 1 to 300 parts by weight, particularly preferably 10 to 200 parts by weight based on 100 parts by weight of the polyfunctional monomer (C). When the amount of the photopolymerization initiator is less than 0.01 part by weight, curing by exposure is insufficient with the result that a pixel pattern may be partially or completely lost or undercut. On the other hand, when the amount is more than 500 parts by weight, the formed pixels fall off from the substrate easily at the time of development, and surface stains or residues are readily produced in an area other than a portion(s) where pixels are formed.

Additives

The radiation sensitive composition for color filters of the present invention may contain various additives as required.

The additives include, for example, dispersion aids such as blue pigment derivatives including copper phthalocyanine derivatives and yellow pigment derivatives; fillers such as glass and alumina; polymer compounds such as polyvinyl alcohols, polyethylene glycol monoalkyl ethers and poly (fluoroalkyl acrylates); surfactants such as nonionic, cationic and anionic surfactants; adhesion promoting agents such as vinyltrimethoxysilane, vinyltriethoxysilane, vinyltris(2-methoxyethoxy)silane, N-(2-aminoethyl)-3-aminopropylmethyl dimethoxysilane, N-(2-aminoethyl)-3-aminopropyl trimethoxysilane, 3-aminopropyl triethoxysilane, 3-glycidoxypropyl trimethoxysilane, 3-glycidoxypropylmethyl dimethoxysilane, 2-(3,4-epoxycyclohexyl)ethyl trimethoxysilane, 3-chloropropylmethyl dimethoxysilane, 3-chloropropyl trimethoxysilane, 3-methacryloxypropyl trimethoxysilane and 3-mercaptopropyl trimethoxysilane; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; coagulation preventing agents such as sodium polyacrylate; and the like.

Further, the radiation sensitive composition for color filters of the present invention may contain an organic acid to further improve the solubility in an alkali developer of a coating film formed therefrom and inhibiting the remain of undissolved residues after development when the alkali-soluble resin (B) has a carboxyl group like the alkali-soluble resin (I). The organic acid is preferably an aliphatic carboxylic acid or phenyl group-containing carboxylic acid having a molecular weight of 1,000 or less.

Illustrative examples of the aliphatic carboxylic acid include monocarboxylic acids such as formic acid, acetic acid, propionic acid, butyric acid, valeric acid, pivalic acid, caproic acid, diethylacetic acid, enanthic acid and caprylic acid; dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, cyclohexanedicarboxylic acid, itaconic acid, citraconic acid, maleic acid, fumaric acid and mesaconic acid; and tricarboxylic acids such as tricarballylic acid, aconitic acid and camphoric acid.

The phenyl group-containing carboxylic acid is an aromatic carboxylic acid having a carboxyl group directly bonded to a phenyl group, carboxylic acid having a carboxyl group bonded to a phenyl group via a carbon chain, or the like. Illustrative examples of the phenyl group-containing carboxylic acid include aromatic monocarboxylic acids such as benzoic acid, toluic acid, cuminic acid, hemellitic acid and mesitylenic acid; aromatic dicarboxylic acids such as phthalic acid, isophthalic and terephthalic acid; aromatic polycarboxylic acids having a valence of 3 or more such as trimellitic acid, trimesic acid, mellophanic acid and pyromellitic acid; phenylacetic acid, hydroatropic acid, hydrocinnamic acid, mandelic acid, phenylsuccinic acid, atropic acid, cinnamic acid, cinnamylidenic acid, coumaric acid, umbellic acid and the like.

Of these organic acids, aliphatic dicarboxylic acids and aromatic dicarboxylic acids such as malonic acid, adipic acid, itaconic acid, citraconic acid, fumaric acid, mesaconic acid and phthalic acid are preferred in view of alkali solubility, solubility in a solvent to be described hereinafter and the prevention of surface stains or residues in an area other than a portion(s) where pixels are formed.

The above organic acids may be used alone or in admixture of two or more.

The amount of the organic acid used in the present invention is preferably 10% by weight or less, more preferably 0.001 to 10% by weight, the most preferably 0.01 to 1% by weight of the whole radiation sensitive composition. When the amount is more than 10% by weight, the adhesion of the formed pixels to the substrate is liable to deteriorate.

Solvent

The radiation sensitive composition for color filters of the present invention comprises the above colorant (A), the above alkali-soluble resin (B), the above polyfunctional monomer (C) and the above photopolymerization initiator (D) as essential components and may contain the above additive components as required. All the above components except the colorant (A) are generally dissolved in an appropriate solvent to prepare a liquid composition.

Any solvents can be properly and selectively used as long as they can disperse or dissolve, and do not react with, the colorant (A), the alkali-soluble resin (B), the polyfunctional monomer (C), the photopolymerization initiator (D) and the additive components and have appropriate volatility.

Illustrative examples of the solvent include (poly) alkylene glycol monoalkyl ethers such as ethylene glycol monomethyl ether, ethylene glycol monoethyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, ethylene glycol mono-n-propyl ether acetate, ethylene glycol mono-n-butyl ether acetate, diethylene glycol monomethyl ether acetate, diethylene glycol monoethyl ether acetate, diethylene glycol mono-n-propyl ether acetate, diethylene glycol mono-n-butyl ether acetate, propylene glycol monomethyl ether acetate and propylene glycol monoethyl ether acetate; other ethers such as diethylene glycol dimethyl ether, diethylene glycol methyl ethyl ether, diethylene glycol diethyl ether and tetrahydrofuran; ketones such as methyl ethyl ketone, cyclohexanone, 2-heptanone and 3-heptanone; lactic acid alkyl esters such as methyl-2-hydroxypropionate and ethyl-2-hydroxypropionate; other esters such as methyl-2-hydroxy-2-methylpropionate, ethyl-2-hydroxy-2-methylpropionate, methyl-3-methoxypropionate, ethyl-3-methoxypropionate, methyl-3-ethoxypropionate, ethyl-3-ethoxypropionate, ethyl ethoxyacetate, ethyl hydroxyacetate, methyl-2-hydroxy-3-methylbutyrate, 3-methoxybutyl acetate, 3-ethoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-amyl acetate, i-amyl acetate, n-butyl propionate, ethyl butyrate, n-propyl butyrate, i-propyl butyrate, n-butyl butyrate, methyl pyruvic acid ester, ethyl pyruvic acid ester, n-propyl pyruvic acid ester, methyl acetoacetate, ethyl acetoacetate and ethyl-2-oxobutyrate; aromatic hydrocarbons such as toluene and xylene; carboxylic acid amides such as N-methylpyrrolidone, N,N-dimethylformamide, and N,N-dimethylacetoamide; and the like.

These solvents may be used alone or in admixture of two or more.

A high-boiling solvent such as benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and ethylene glycol monophenyl ether acetate can be used in combination with the above solvents.

These high-boiling solvents may be used alone or in admixture of two or more.

Of the above solvents, ethylene glycol monomethyl ether acetate, ethylene glycol monoethyl ether acetate, ethylene glycol mono-n-butyl ether acetate, propylene glycol monomethyl ether acetate, propylene glycol monoethyl ether acetate, propylene glycol monomethyl ether, diethylene glycol dimethyl ether, diethylene glycol methyl ethyl ether, diethylene glycol n-butyl ethyl acetate, cyclohexanone, 2-heptanone, 3-heptanone, ethyl 2-hydroxypropionate, butyl 3-methoxyacetate, 3-methyl-3-methoxybutyl propionate, ethyl 3-methoxypropionate, methyl 3-ethoxypropionate, ethyl 3-ethoxypropionate, n-butyl acetate, i-butyl acetate, n-amyl acetate, i-amyl acetate, n-butyl propionate, ethyl butyrate, i-propyl butyrate, n-butyl butyrate and ethyl pyruvic acid ester are preferred in view of solubility, pigment dispersibility and coating properties, and of the above high-boiling solvents, γ-butyrolactone is preferred.

The amount of the solvent used in the present invention is preferably 100 to 10,000 parts by weight, more preferably 500 to 5,000 parts by weight, based on 100 parts by weight of the alkali-soluble resin (B).

Method of forming a color filter

A description is subsequently given of a method of forming a color filter using the radiation sensitive composition for color filters of the present invention.

A light shading layer is first formed to define a portion where pixels are formed on the surface of a substrate. A liquid radiation sensitive composition comprising, for example, a red pigment dispersed therein is coated on this substrate and prebaked to evaporate the solvent so as to form a coating film. Then, the coating film is exposed to radiation through a photomask, and developed with an alkali developer to dissolve and remove unexposed portions of the coating film to form an array of red pixels arranged in a predetermined pattern.

Thereafter, liquid radiation sensitive compositions comprising green and blue pigment dispersed therein are coated on the surface, prebaked, exposed and developed in the same manner as described above to form arrays of green pixels and blue pixels on the same substrate in order. Thus, a color filter having arrays of three red, green and blue pixels arranged on the substrate is obtained.

The substrate used to form the color filter is selected from glass, silicon, polycarbonate, polyester, aromatic polyamide, polyamideimide, polyimide or the like. The substrate can be subjected, as desired, to a suitable pre-treatment such as chemical treatment with a silane coupling agent or the like, plasma treatment, ion plating, sputtering, gas vapor reaction process or vacuum vapor deposition.

To coat the liquid radiation sensitive composition onto the substrate, a rotation coating, cast coating, roll coating or the like can be suitably employed.

The thickness of the coating film after drying is preferably 0.1 to 10 μm, more preferably 0.2 to 5.0 μm, particularly preferably 0.2 to 3.0 μm.

The radiation used to form a color filter is selected from visible light, ultraviolet light, far ultraviolet light, electron beams, X-rays and the like. It preferably has a wavelength of 190 to 450 nm. The irradiation energy of the radiation is preferably 1 to 1,000 mJ/cm².

The alkali developer is preferably an aqueous solution of sodium carbonate, sodium hydroxide, potassium hydroxide, tetramethyl ammonium hydroxide, choline, 1,8-diazabicyclo-[5.4.0]-7-undecene, 1,5-diazabicyclo-[4.3.0]-5-nonene or the like.

The alkali developer may contain a water-soluble organic solvent such as methanol or ethanol or a surfactant in a suitable amount. After alkali development, the alkali developer is generally washed away with water.

Development is carried out by shower development, spray development, dip development, puddle development or the like at normal temperature for 5 to 300 seconds.

The thus formed color filter is extremely useful in color liquid crystal display devices, color image pick-up tube elements, color sensors and the like.

COMPARATIVE EXAMPLE 1

100 Parts by weight of carbon black as the colorant (A), 50 parts by weight of methacrylic acid/benzyl methacrylate/2-hydroxyethyl methacrylate/polystyrene macromonomer (weight ratio of 15/60/15/10) copolymer as the alkali-soluble resin (B), 40 parts by weight of dipentaerythritol hexacrylate as the polyfunctional monomer (C), 30 parts by weight of 2-benzyl-2-dimethylamino-1-(4-morpholinophenyl)-butane-1-one as the photopolymerization initiator (D) and 1,500 parts by weight of ethyl-3-ethoxypropionate as a solvent were mixed together to prepare a liquid radiation sensitive composition.

This liquid composition was coated onto the surface of a soda glass substrate having a $SiO_2$ film for preventing the elution of sodium ions formed on the surface with a spin coater, and prebaked at 90° C. for 4 minutes to form a 1.3 μm-thick coating film. Thereafter, the substrate was cooled to room temperature and exposed to 200 mJ/cm² of ultraviolet light having a wavelength of 365 nm through a photomask using a high-pressure mercury lamp. The substrate was then immersed in a 0.04% by weight aqueous solution of potassium hydroxide heated at 23° C. for 1 minute, developed, washed with ultra-pure water and dried with air. Thereafter, it was post-baked at 250° C. for 30 minutes to produce a black matrix having a black pixel pattern formed on the substrate.

Residues were observed on unexposed portions of the substrate and a partial or complete loss of the pixel pattern was observed in the obtained black matrix. When a peel test was made on the obtained black matrix using adhesive tape, peeling off of the pixel pattern was caused. Further, when the obtained pixels were heated, a weight reduction started at around 200° C. and a 20% by weight reduction was observed at around 300° C. The results are shown in Table 1.

COMPARATIVE EXAMPLE 2

A liquid radiation sensitive composition was prepared in the same manner as in Comparative Example 1 except that 50 parts by weight of methacrylic acid/styrene/benzyl methacrylate (weight ratio of 20/20/60) copolymer was used as the alkali-soluble resin in place of 50 parts by weight of the alkali-soluble resin in Comparative Example 1.

Using this liquid composition, a black matrix having a black pixel pattern formed on the substrate was produced in the same manner as in Comparative Example 1.

The obtained black matrix was evaluated in the same manner as in Comparative Example 1. The results are shown in Table 1.

EXAMPLE 1

A liquid radiation sensitive composition was prepared in the same manner as in Comparative Example 1 except that 50 parts by weight of N-phenylmaleimide/methacrylic acid/styrene/benzyl methacrylate (weight ratio of 30/20/20/30) copolymer as the alkali-soluble resin (I) in place of 50 parts by weight of the alkali-soluble resin in Comparative Example 1.

Using this liquid composition, a black matrix having a black pixel pattern formed on the substrate was produced in the same manner as in Comparative Example 1.

Residues or surface stains were not observed on unexposed portions of the substrate and the light shading layer and a partial or complete loss of the pixel pattern was not observed in the obtained black matrix. When a peel test was made on the obtained black matrix using adhesive tape, the pixel pattern was not peeled off. Further, when the obtained pixels were heated, a weight reduction was not observed at a temperature up to 300° C. The results are shown in Table 1.

EXAMPLE 2

A liquid radiation sensitive composition was prepared in the same manner as in Comparative Example 1 except that 50 parts by weight of N-p-methylphenylmaleimide/methacrylic acid/styrene/benzyl methacrylate (weight ratio of 30/20/20/30) copolymer was used as the alkali-soluble resin (I) in place of 50 parts by weight of the alkali-soluble resin in Comparative Example 1.

Using this liquid composition, a black matrix having a black pixel pattern formed on the substrate was produced in the same manner as in Comparative Example 1.

The obtained black matrix was evaluated in the same manner as in Comparative Example 1. The results are shown in Table 1.

EXAMPLE 3

A liquid radiation sensitive composition was prepared in the same manner as in Comparative Example 1 except that 50 parts by weight of N-phenylmaleimide/methacrylic acid/α-methylstyrene/benzyl methacrylate (weight ratio of 30/20/20/30) copolymer was used as the alkali-soluble resin (I) in place of 50 parts by weight of the alkali-soluble resin in Comparative Example 1.

Using this liquid composition, a black matrix having a black pixel pattern formed on the substrate was produced in the same manner as in Comparative Example 1.

The obtained black matrix was evaluated in the same manner as in Comparative Example 1. The results are shown in Table 1.

EXAMPLE 4

A liquid radiation sensitive composition was prepared in the same manner as in Comparative Example 1 except that 50 parts by weight of N-phenylmaleimide/acrylic acid/styrene/benzyl methacrylate (weight ratio of 30/20/20/30) copolymer was used as the alkali-soluble resin (I) in place of 50 parts by weight of the alkali-soluble resin in Comparative Example 1.

Using this liquid composition, a black matrix having a black pixel pattern formed on the substrate was produced in the same manner as in Comparative Example 1.

The obtained black matrix was evaluated in the same manner as in Comparative Example 1. The results are shown in Table 1.

EXAMPLE 5

A liquid radiation sensitive composition was prepared in the same manner as in Example 1 except that 80 parts by weight of C.I. Pigment Red 177 was used as the colorant (A) in place of 100 parts by weight of carbon black in Example 1.

Using this liquid composition, a color filter having a red pixel pattern formed on the substrate was produced in the same manner as in Comparative Example 1.

The obtained color filter was evaluated in the same manner as in Comparative Example 1. The results are shown in Table 1.

|  | Residues on unexposed portions of substrate | Partial or complete loss of pixel pattern | Adhesion of pixel pattern to substrate | Heat resistance of pixels (weight reduction at 300° C.) |
|---|---|---|---|---|
| Comp. Ex 1 | observed | observed | peeled off | 20 wt % |
| Comp. Ex 2 | observed | observed | peeled off | 15 wt % |
| Example 1 | not-observed | not-observed | not peeled off | 2 wt % |
| Example 2 | not-observed | not-observed | not peeled off | 3 wt % |
| Example 3 | not-observed | not-observed | not peeled off | 2 wt % |
| Example 4 | not-observed | not-observed | not peeled off | 3 wt % |
| Example 5 | not-observed | not-observed | not peeled off | 3 wt % |

Comp. Ex = Comparative Example

The radiation sensitive composition for color filters of the present invention does not produce residues or surface stains on unexposed portions of the substrate and light shading layer at the time of development and provides pixels having excellent adhesion to the substrate and the light shading layer. In addition, the pixels post-baked after development have excellent heat resistance, and pixels with high-definition and high-quality can be formed by photolithography.

Therefore, the radiation sensitive composition for color filters of the present invention can be extremely advantageously used in the production of a variety of color filters such as color filters for color liquid crystal display devices, color filters for the color separation of solid pick-up elements or the like in the field of the electronic industry.

What is claimed is:

1. A radiation sensitive composition comprising:
   (A) a colorant;
   (B) an alkali-soluble resin comprising a copolymer of N-phenylmaleimide and a combination of styrene and at least one monomer selected from the group consisting of acrylic acid and methacrylic acid;
   (C) a polyfunctional monomer; and
   (D) a photopolymerization initiator
   wherein said copolymer is at least one copolymer selected from the group consisting of N-phenylmaleimide/methacrylic acid/styrene/benzyl methacrylate copolymer, N-phenylmaleimide/methacrylic acid/styrene/phenyl methacrylate copolymer N-phenylmaleimide/methacrylic acid/styrene/benzyl methacrylate/polystyrene macromonomer copolymer, N-phenylmaleimide/methacrylic acid/styrene/benzyl methacrylate/polymethyl methacrylate macromonomer copolymer, N-phenylmaleimide/methacrylic acid/styrene/phenyl methacrylate/polystyrene macromonomer copolymer, N-phenylmaleimide/methacrylic acid/styrene/phenyl methacrylate/polymethyl methacrylate macromonomer copolymer, N-phenylmaleimide/methacrylic acid/styrene/2-hydroxyethyl methacrylate/benzyl methacrylate/polystyrene macromonomer copolymer, N-phenylmaleimide/methacrylic acid/styrene/2-hydroxyethyl methacrylate/benzyl methacrylate/polymethyl methacrylate macromonomer copolymer, N-phenylmaleimide/methacrylic acid/styrene/2-hydroxyethyl methacrylate/phenyl methacrylate/polystyrene macromonomer copolymer, and N-phenylmaleimide/methacrylic acid/styrene/2-hydroxyethyl methacrylate/phenyl methacrylate/polymethyl methacrylate macromonomer copolymer.

2. The radiation sensitive composition of claim 1, wherein the colorant (A) is at least one member selected from the group consisting of carbon black and an organic pigment.

3. The radiation sensitive composition of claim 1, which contains the alkali-soluble resin (B) in an amount of 10 to 1,000 parts by weight based on 100 parts by weight of the colorant.

4. The radiation sensitive composition of claim 1, wherein the polyfunctional monomer (C) is a compound having at least two acrylate groups or methacrylate groups in the molecule.

5. The radiation sensitive composition of claim 1, which contains the polyfunctional monomer (C) in an amount of 5 to 500 parts by weight based on 100 parts by weight of the alkali-soluble resin.

6. The radiation sensitive composition of claim 1, wherein the polyfunctional monomer (C) is at least one member selected from the group consisting of trimethylolpropane triacrylate, pentaerythritol triacrylate and dipentaerythritol hexacrylate.

7. The radiation sensitive composition of claim 1, wherein the photopolymerization initiator (D) is a biimidazole compound represented by the following formula (1):

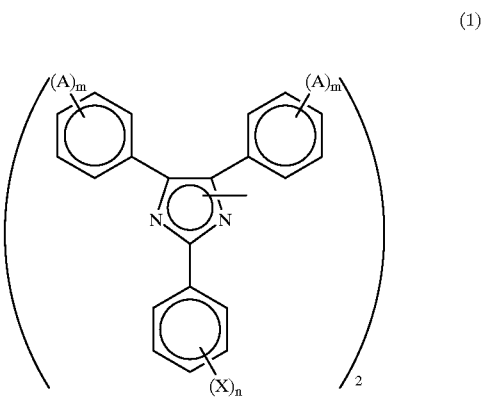

wherein X is a hydrogen atom, halogen atom, cyano group, alkyl group having 1 to 4 carbon atoms or aryl group having 6 to 9 carbon atoms, A is —COO—R A (in which R is an alkyl group having 1 to 4 carbon atoms or aryl group having 6 to 9 carbon atoms), m is an integer of 1 to 3, and n is an integer of 1 to 3.

8. The radiation sensitive composition of claim 7, wherein the biimidazole compound represented by the above formula (1) is at least one compound selected from the group consisting of 2,2'-bis(2-chlorophenyl)-4,4',5,5'-tetrakis(4-ethoxycarbonylphenyl)-1,2'-biimidazole and 2,2'-bis(2-bromophenyl)-4,4',5,5'-tetrakis(4-ethoxycarbonylphenyl)-1,2'-biimidazole.

9. The radiation sensitive composition of claim 1, wherein the photopolymerization initiator (D) is a biimidazole compound represented by the following formula (2):

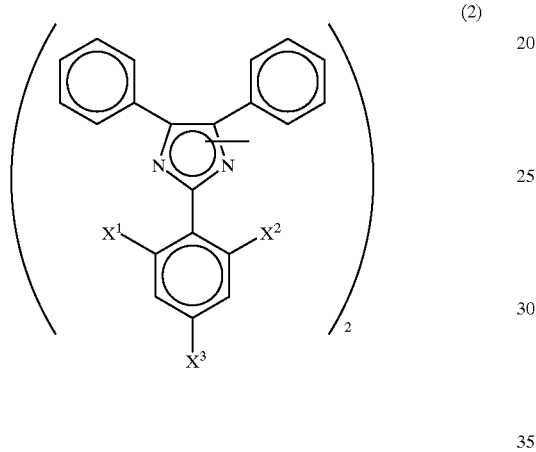

wherein $X^1$, $X^2$ and $X^3$ may be the same or different and are a hydrogen atom, halogen atom, cyano group, alkyl group having 1 to 4 carbon atoms or aryl group having 6 to 9 carbon atoms, provided that two or more of $X^1$, $X^2$ and $X^3$ cannot be a hydrogen atom at the same time.

10. The radiation sensitive composition of claim 9, wherein the biimidazole compound represented by the above formula (2) is at least one compound selected from the group consisting of 2,2'-bis(2,4-dichlorophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-trichlorophenyl)-4,4',5,5'-tetraphenyl-1,2'-biimidazole and 2,2'-bis(2,4,6-tribromophenyl)-4,4',5,51-tetraphenyl-1,2'-biimidazole.

11. The radiation sensitive composition of claim 1, wherein the photopolymerization initiator (D) contains a biimidazole compound represented by formula (I)

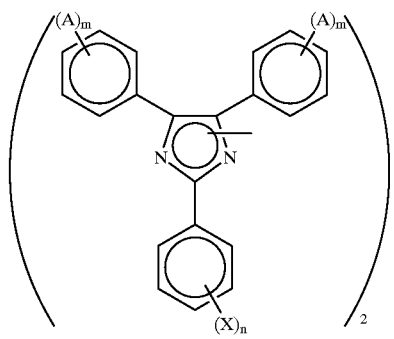

wherein X is a hydrogen atom, halogen atom, cyano group, alkyl group having 1 to 4 carbon atoms or aryl group having 6 to 9 carbon atoms. A is —COO—R in which R is an alkyl group having 1 to 4 carbon atoms or aryl group having 6 to 9 carbon atoms, m is an integer of 1 to 3, and n is an integer of 1 to 3 or (2)

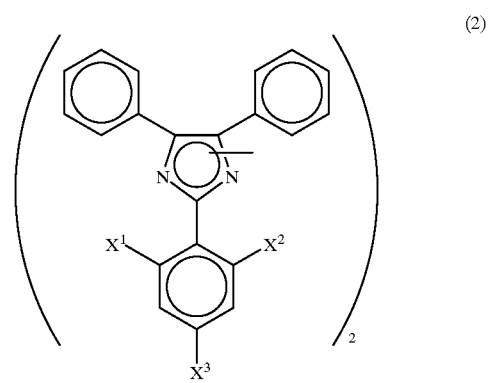

wherein $X^1$, $X^2$ and $X^3$ may be the same or different and are a hydrogen atom, halogen atom, cyano group, alkyl group having 1 to 4 carbon atoms or aryl group having 6 to 9 carbon atoms, provided that two or more of $X^1$, $X^2$ and $X^3$ cannot be a hydrogen atom at the same time and at least one compound selected from the group consisting of a compound having a benzoin bond, other benzophenone photoradical generating agent, benzophenone sensitizer and thiazole curing promoting agent.

* * * * *